United States Patent [19]
Schnabl et al.

[11] Patent Number: 5,903,611
[45] Date of Patent: May 11, 1999

[54] METHOD OF CORRECTING NONLINEARITIES OF AN AMPLIFIER, AND RADIO TRANSMITTER EMPLOYING A METHOD OF THIS TYPE

[75] Inventors: Gottfried Schnabl, Ulm, Germany; Jacques Peltier, Paris, France

[73] Assignee: Matra Communication, Quimper, France

[21] Appl. No.: 08/822,384

[22] Filed: Mar. 20, 1997

[30] Foreign Application Priority Data

Mar. 22, 1996 [FR] France .................................. 96 03617

[51] Int. Cl.[6] .............................. H04K 1/02; H04L 25/03; H04L 25/49; H04L 27/36
[52] U.S. Cl. .......................... 375/297; 375/297; 375/296; 375/298; 455/63; 455/126
[58] Field of Search .................................. 375/297, 298, 375/296; 455/126, 127, 63; 330/149, 107; 332/103, 123; 329/304

[56] References Cited

U.S. PATENT DOCUMENTS

| | | | |
|---|---|---|---|
| 4,462,001 | 7/1984 | Girard | 330/149 |
| 4,700,151 | 10/1987 | Nagata | 332/18 |
| 5,049,832 | 9/1991 | Cavers | 330/149 |
| 5,093,637 | 3/1992 | Isota et al. | |
| 5,113,414 | 5/1992 | Karam et al. | 375/60 |
| 5,351,016 | 9/1994 | Dent | 332/103 |
| 5,420,536 | 5/1995 | Faulkner et al. | |
| 5,486,789 | 1/1996 | Palandech et al. | 330/149 |
| 5,524,286 | 6/1996 | Chiesa et al. | 455/126 |
| 5,650,758 | 7/1997 | Xu et al. | 330/149 |
| 5,699,383 | 12/1997 | Ichiyoshi | 375/297 |
| 5,732,333 | 3/1998 | Cox et al. | 455/126 |
| 5,740,520 | 4/1998 | Cyze et al. | 455/69 |

FOREIGN PATENT DOCUMENTS

| | | |
|---|---|---|
| 0 632 624 | 1/1995 | European Pat. Off. . |
| 0 658 975 | 6/1995 | European Pat. Off. . |
| 2 239 770 | 7/1991 | United Kingdom . |
| 2 272 589 | 5/1994 | United Kingdom . |
| 2 283 629 | 5/1995 | United Kingdom . |
| WO 93/18602 | 9/1993 | WIPO . |

OTHER PUBLICATIONS

Y. Levy, G. Karam, and H. Sari, "Adaptation of a digital predistortion technique based on intersymbol interpolation," Global Telecommunications Conference, pp. 145–150, 1995.

Faulkner et al. "Adaptive Linearisation Using Pre–distorsion", Proc. of the 40th IEEE Veh. Tech. Conf., 1990, pp. 35–40.

*Primary Examiner*—Stephen Chin
*Assistant Examiner*—Michael W. Maddox
*Attorney, Agent, or Firm*—Evenson, McKeown, Edwards & Lenahan, P.L.L.C.

[57] ABSTRACT

In order to correct nonlinearities of an amplifier which receives a radio signal and produces an amplified radio signal representing an input complex digital signal, a predistortion table, associating a value of a predistorted complex digital signal with each value of the input complex digital signal, is stored, and the predistorted complex signal is modulated in order to obtain the radio signal addressed to the amplifier. In an adaptation period, a fraction of the amplified radio signal is demodulated in order to obtain a demodulated complex signal which is compared with the input complex signal, with which the predistorted complex signal modulated in said adaptation period is associated, in order to update the predistortion table. The predistortion table is updated on the basis of mean values calculated from blocks of samples of the input complex signal and of the demodulated complex signal, which are stored in the adaptation period.

14 Claims, 6 Drawing Sheets

METHOD OF CORRECTING NONLINEARITIES OF AN AMPLIFIER, AND RADIO TRANSMITTER EMPLOYING A METHOD OF THIS TYPE

BACKGROUND OF THE INVENTION

The present invention relates to a method for correcting nonlinearities of a radio power amplifier.

The invention finds applications in radio transmitters, in particular mobile radio communications stations.

Mobile radio communications digital systems are increasingly making use of radio modulations with non-constant envelope in order to improve the spectral efficiency of the system. These modulations with nonconstant envelope comprise, in particular, quadrature phase shift keying modulations (QPSK, OQPSK or π/4-QPSK), or quadrature amplitude modulations (n-QAM).

For a given data rate, these modulations have the advantage of requiring a smaller frequency bandwidth than the modulations with constant envelope which are frequently used, such as GMSK modulation. The downside of this advantage is that modulations with nonconstant envelope require a very linear transmission system in order to avoid spectral broadening due to nonlinearities. The critical point of this system is usually the power amplifier of the transmitter. In the case of a mobile radio communications station, for which the electrical power consumption must be minimized, the use of a class A linear amplifier is not generally acceptable because of its inadequate efficiency. A more appropriate solution consists in using a nonlinear amplifier with high efficiency, combined with a linearization technique.

The technique of adaptive linearization using predistortion is an amplifier linearization technique which can be used for this purpose. This technique is described in the article "Adaptive Linearisation Using Predistortion" by M. Faulkner et al. (Proc. of the 40th IEEE Veh. Tech. Conf. 1990, pages 35–40), and in U.S. Pat. No. 5,093,637. The technique of adaptive linearization using predistortion consists in applying a predistortion table to the baseband complex signal. This table is calculated digitally by comparing the baseband signal and a demodulated signal obtained from the amplified radio signal. This calculation consists in modifying the predistortion table in order to obtain a table which corrects the distortions of the transmission system. After an initial adaptation period, the predistortion table corrects the nonlinearities of the amplifier.

The predistortion algorithms employed are generally based on the assumption that the distortion introduced by the power amplifier depends only on the modulus of the complex baseband signal, and not on its phase (AM-AM and AM-PM distortions only) . Consequently, predistortion functions are chosen which depend only on the modulus of the signal. Nevertheless, some distortions may also be introduced by the modulator used to transpose the signal around the carrier frequency, as well as by the demodulator producing the demodulated signal which is useful in the adaptation periods. The modulator and the demodulator may have balance and/or quadrature defects which, besides introducing PM-AM and PM-PM distortions, risk making the adaptation algorithm converge to an inappropriate predistortion table. The demodulated signal may further have an offset with respect to the baseband adaptation signal. Another problem which may interfere with the convergence of the predistortion algorithm is the presence of noise in the demodulated signal.

One object of the present invention is to provide an efficient linearization technique which is affected less by the problems above.

SUMMARY OF THE INVENTION

The invention thus provides a method of correcting nonlinearities of an amplifier which receives a radio signal and produces an amplified radio signal representing an input complex digital signal, wherein a predistortion table, associating a value of a predistorted complex digital signal with each value of the input complex digital signal, is stored, and the predistorted complex signal is modulated in order to obtain the radio signal addressed to the amplifier. In an adaptation period, a fraction of the amplified radio signal is demodulated in order to obtain a demodulated complex signal which is compared with the input complex signal, with which the predistorted complex signal modulated in said adaptation period is associated, in order to update the predistortion table. According to the invention, the predistortion table is updated on the basis of mean values calculated from blocks of samples of the input complex signal and of the demodulated complex signal which are stored in the adaptation period.

The fact that the table is updated on the basis of mean values calculated over blocks of samples, rather than on the basis of individual samples, allows the algorithm to be relatively insensitive to insignificant fluctuations which the demodulated signal may have because of the influence of noise, or balance and/or quadrature defects of the modulator or the demodulator.

In a typical embodiment, the modulus of the input complex signal is quantized for addressing in the predistortion table, the predistortion table associating a modulus value and a phase-shift value for the predistorted signal with each quantizing value of the modulus of the input complex signal. It is then possible to provide, for each quantizing value of the modulus of the input complex signal, a calculation of the mean value of the difference in modulus between the demodulated complex signal and the input complex signal, and of the mean value of the phase difference between the demodulated complex signal and the input complex signal, said mean values being calculated for the samples of the input complex signal in the block stored in the adaptation period, whose modulus is quantized by said quantizing value, and an update of the modulus value and of the phase-shift value of the predistorted complex signal which are associated with said quantizing value, on the basis of said calculated mean values.

Preferably, each block of samples of the demodulated complex signal is stored in the form of in-phase components and quadrature components, the mean value of the in-phase components of the block and the mean value of the quadrature components of the block are estimated, and a corrected demodulated complex signal is produced in order to update the predistortion table by respectively subtracting, from the stored in-phase and quadrature components of each sample of the demodulated complex signal, the estimated mean values of said in-phase and quadrature components. This makes it possible to evaluate and correct an offset which the demodulated signal may have.

The invention also allows precise adjustment of the delay which is to be applied to the adaptation signal before comparing it with the demodulated signal. This delay can be estimated from a correlation, between the moduli of the adaptation signal and of the demodulated signal, calculated over a set of samples in the stored blocks.

Advantageously, the input complex signal or the predistorted complex signal has a phase which is constant modulo $\pi$ in the adaptation period.

If a complex signal has a real part, or in-phase component, of the form $I=\rho \cos \phi$, and an imaginary part, or quadrature component, of the form $Q=\rho \sin \phi$, the "phase" of the complex signal means the argument $\phi$ of the complex number $I+jQ$. When this phase is constant (modulo $\pi$) for the input complex digital signal or the predistorted complex digital signal in the adaptation period, the adaptation algorithm of the predistortion table is affected little by the PM-AM and PM-PM distortions which may result from defects of the modulator or of the demodulator. This results in better performance of the method for correcting the nonlinearities, by virtue of better convergence of the algorithm.

Preferably, the input complex signal has a narrower spectrum within the adaptation period than outside the adaptation period. This limits the undesirable transmissions outside the allotted bandwidth, in the adaptation periods during which the adaptation algorithm of the tables has not yet converged.

Another aspect of the present invention relates to a radio transmitter, comprising: a digital signal source generating an input complex digital signal; predistortion means producing a predistorted complex digital signal on the basis of the input complex signal and of a predistortion table; modulation means producing a radio signal from the predistorted complex signal; a power amplifier for amplifying the radio signal and applying it to a transmission antenna; and demodulation means producing a demodulated complex signal from a fraction of the amplified radio signal. The predistortion means are designed to update the predistortion table on the basis of a comparison between the demodulated complex signal, produced by the demodulation means in at least one adaptation period, and the input complex signal, with which the predistorted complex signal produced in said adaptation period by the predistortion means is associated. The predistortion means are designed to update the predistortion table on the basis of mean values calculated from blocks of samples of the input complex signal and of the demodulated complex signal which are stored in the adaptation period.

DESCRIPTION OF PREFERRED EMBODIMENTS

Figure 1:
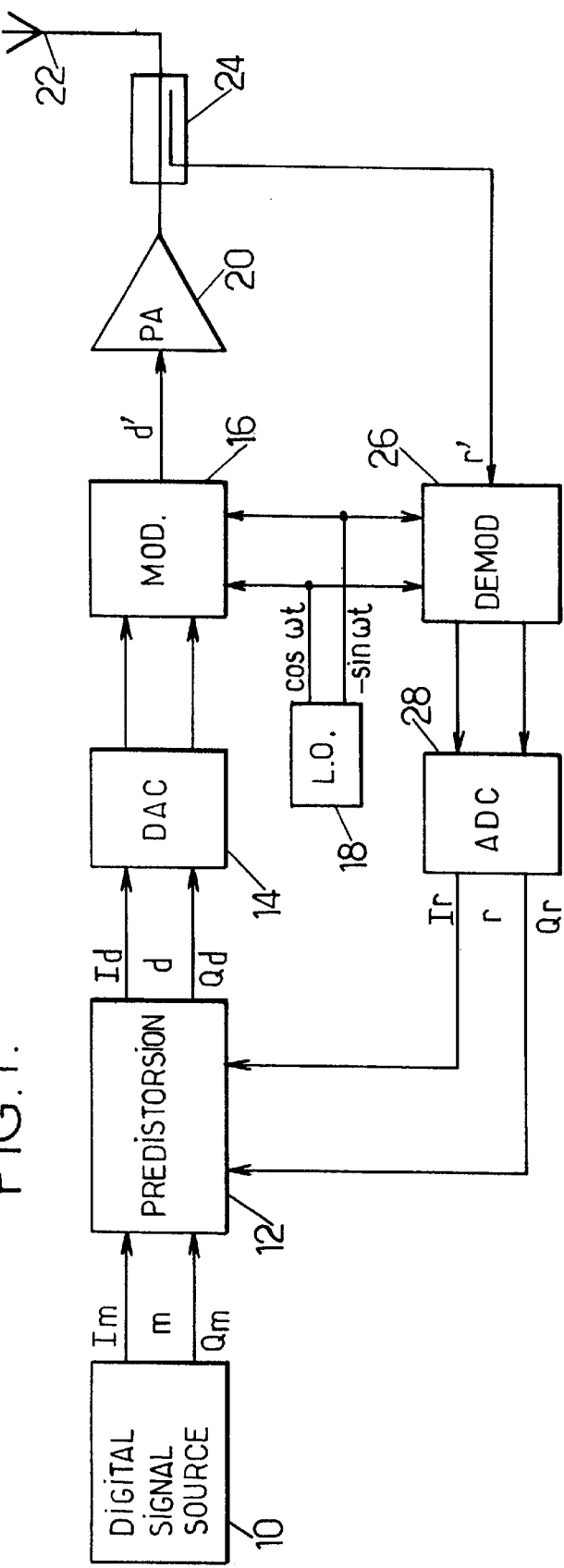
FIG. 1 is a block diagram of a radio transmitter designed for implementing the present invention.

The radio transmitter represented in FIG. 1 forms, for example, part of a mobile digital radio communications station. The reference 10 denotes a digital signal source producing an input complex signal m in the form of an in-phase component $I_m$ and a quadrature component $Q_m$ at a sampling frequency $F_s$. A predistortion unit 12 applies a predistortion to the input signal m in order to produce a predistorted complex digital signal d having an in-phase component $I_d$ and a quadrature component $Q_d$. This predistorted signal is converted into analog form by a digital/analog converter 14, then fed to a quadrature modulator 16. On the basis of the predistorted signal and two waves $\cos \omega t$ and $-\sin \omega t$ in quadrature, which are provided by a local oscillator 18, the modulator 16 delivers a radio signal d'. If $\rho_d$ and $\phi_d$ respectively denote the amplitude and phase of the predistorted signal, the radio signal d' is normally of the form $\rho_d \cos(\omega t+\phi_d)$, the frequency $f=\omega/2\pi$ being the nominal frequency of the communication channel used.

The power amplifier 20 amplifies the radio signal d' and feeds the amplified radio signal to the antenna 22 of the transmitter. A coupler 24 samples a fraction r' of the amplified radio signal at the output of the amplifier 20. This fraction r' is fed to a quadrature demodulator 26 which, with the aid of the waves $\cos \omega t$ and $-\sin \omega t$ output by the local oscillator, produces a demodulated complex signal r. The in-phase $I_r$ and quadrature $Q_r$ components of the demodulated signal are digitized by an analog/digital converter 28 at the sampling frequency $F_s$, over the same number of bits as the components of the input signal m (for example 12 bits).

Figure 2:
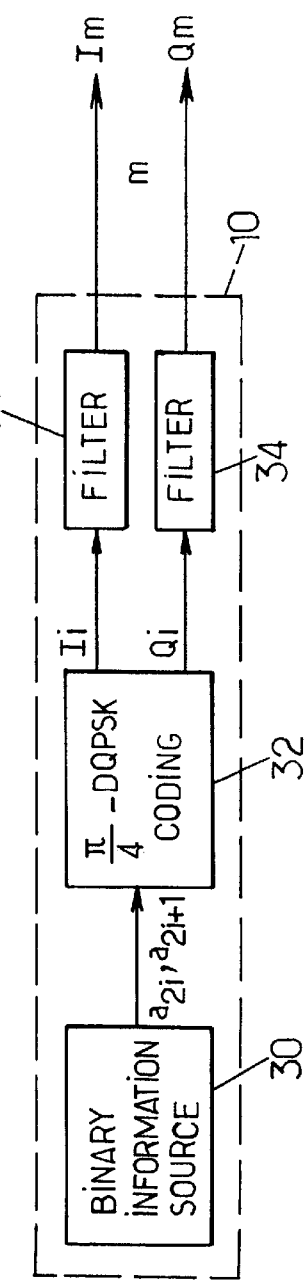
FIG. 2 is a block diagram of a digital signal source of the transmitter in FIG. 1.

FIG. 2 shows a block diagram of the digital signal source 10. The reference 30 denotes the binary data source of the transmitter, which delivers data bits $a_0, a_1, \ldots$ coded and shaped according to the inherent formats of the radio communications system adopted. A logic unit 32 codes the data bits in order to produce in-phase $I_i$ and quadrature $Q_i$ coded components at a rate which is half that of the data bits in accordance with the modulation type used. This modulation has a nonconstant envelope. In the example considered, this is differential modulation using quadrature phase shift keying with phase jumps of $\pm\pi/4$ or $\pm 3\pi/4$ ($\pi/4$-DQPSK modulation). The components $I_i$ and $Q_i$ of the sample i of the coded complex signal are then of the form $\cos \phi_i$ and $\sin \phi_i$ respectively, the phase jump $\phi_{i+1}-\phi_i$ depending on the values of the two successive data bits $a_{2i}, a_{2i+1}$ in the manner indicated in Table I.

TABLE I

| $a_{2i}$ | $a_{2i+1}$ | $\phi_{i+1}-\phi_i$ |
| --- | --- | --- |
| 0 | 0 | $+\pi/4$ |
| 0 | 1 | $+3\pi/4$ |
| 1 | 0 | $-\pi/4$ |
| 1 | 1 | $-3\pi/4$ |

Figure 3:
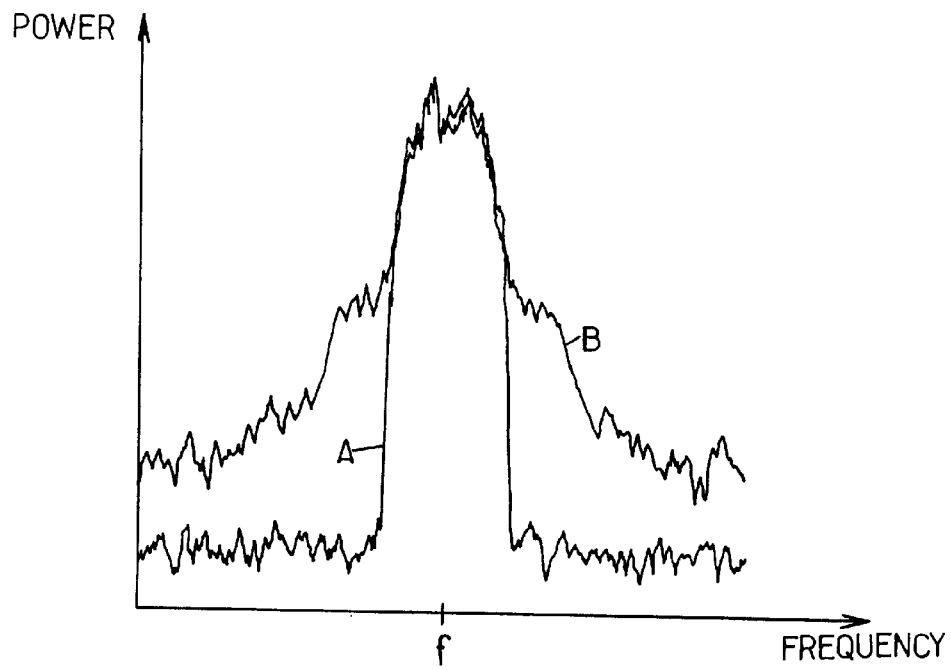
FIG. 3 is a graph showing the effect of the nonlinearities of an amplifier on the spectrum of a radio signal.

In order to limit the spectral width of the signal, the sampling frequency $F_s$ is greater than the data bit rate. For example, if the data bits $a_{2i}, a_{2i+1}$ have a rate of 36 kbit/s, the complex samples $I_i, Q_i$ are at a rate of 18 kbit/s, and they can be oversampled by a factor of 8 in order to give a sampling frequency $F_s$ of 144 kHz. The components $I_i$ and $Q_i$ are each shaped by a filter 34 of the half-Nyquist type designed for the oversampling frequency $F_s$. This produces the baseband input signal m having a spectrum confined in a bandwidth of 18 kHz. It is then possible to produce multiple frequency channels, at intervals of 25 kHz for example, in the radio communications system, ensuring intensive use of the available bandwidth. However, it is expedient to ensure that the transmission system does not generate spectral components outside the 18 kHz band, in order not to interfere with the adjacent channels. By way of illustration, FIG. 3 shows the spectrum of the π/4-DQPSK radio signal amplified linearly (curve A) and amplified with a nonlinear amplifier with high efficiency (curve B). The spectral broadening due to the nonlinearities is not acceptable. This is the reason why the predistortion unit 12 is provided, the role of which is to compensate for the nonlinearities of the power amplifier 20.

Figure 4:
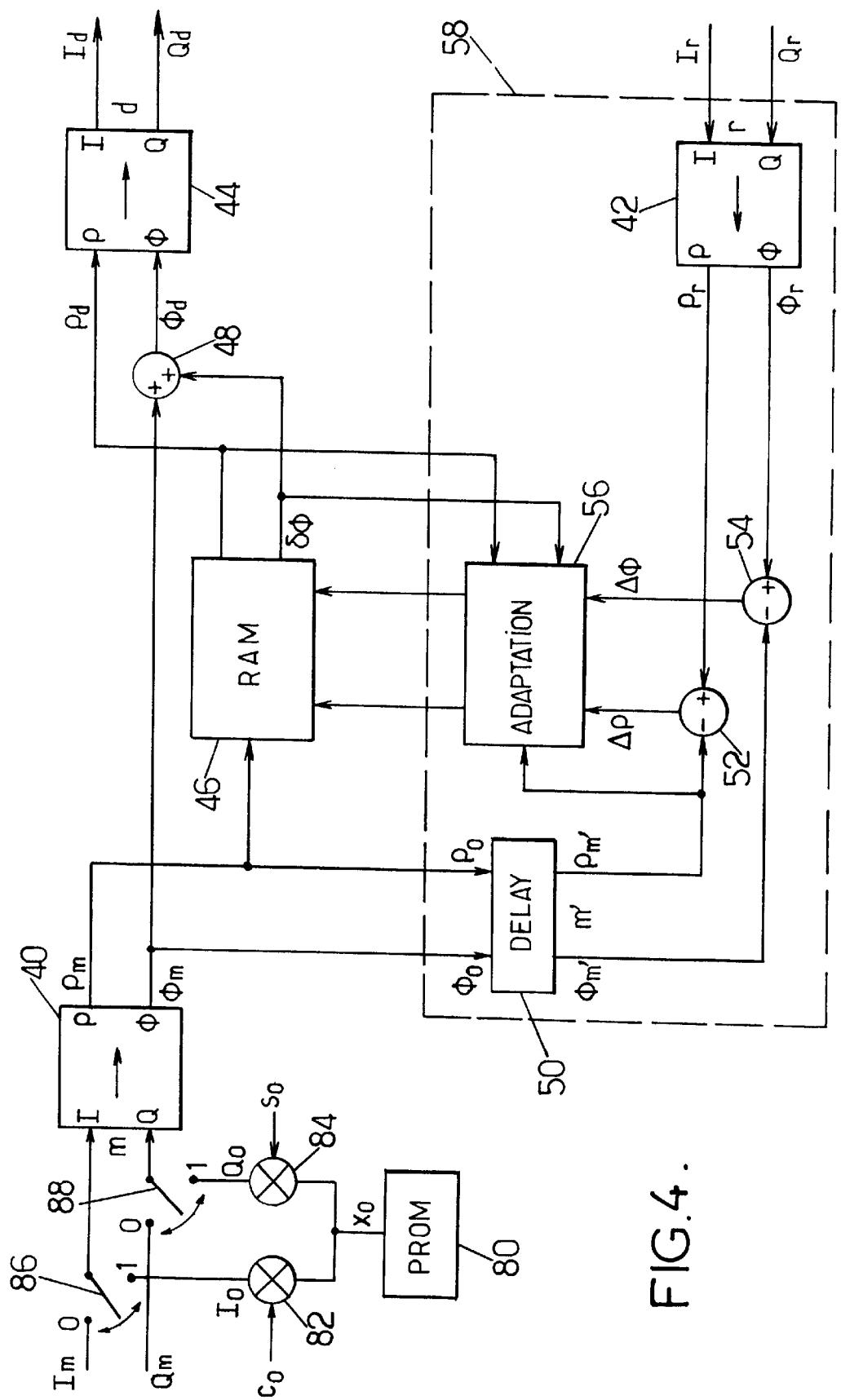
FIG. 4 is a block diagram of a predistortion unit of the transmitter in FIG. 1.

FIG. 4 shows an illustrative embodiment of the predistortion unit 12. Since the distortions introduced by the amplifier 20 are assumed to be of the AM-AM and AM-PM type, the predistortion is applied in polar coordinates ρ, φ, and not in Cartesian coordinates I, Q. Three arithmetic units 40, 42, 44 are thus provided, respectively in order to convert the input signal m into polar coordinates $\rho_m$, $\phi_m$, in order to convert the demodulated signal r into polar coordinates $\rho_r$, $\phi_r$, and in order to convert the predistorted signal d, calculated in polar coordinates $\rho_d$, $\phi_d$, into Cartesian coordinates $I_d$, $Q_d$. The modulus $\rho_m$ of the input signal is used as an address pointer in a random-access memory (RAM) 46 which stores a predistortion table associating, with each quantized value of $\rho_m$, a value of the modulus $\rho_d$ of the predistorted signal and a phase-shift value δφ which is to be applied in order to predistort the signal. In practice, in order to limit the required memory size, addressing in the memory 46 may take place with the aid of $\log_2 K$ most significant bits of $\rho_m$, for example the 5 most significant bits for a predistortion table with K=32 entries, it being possible for the stored values $\rho_d$, δφ to be quantized over 12 bits. An adder 48 adds the phase shift δφ to the phase $\phi_m$ of the input signal in order to produce the phase $\phi_d$ of the predistorted signal.

The values contained in the predistortion table are calculated adaptively. During an adaptation period, the input complex signal m is not the signal delivered by the filter 34, but is a special adaptation signal. These adaptation periods are dedicated to the linearization of the amplifier, and not to the transmission of a useful signal. By way of example, in the case of a time division multiple access (TDMA) system with transmission time intervals of 510 bits at 36 kbit/s, it is possible to provide initial adaptation periods corresponding to time intervals of 238 bits (i.e. 952 complex samples or ~6.6 ms) which are dedicated to the convergence of the predistortion algorithm and, at the start of each transmission time interval, an adaptation period of 32 bits (i.e. 128 complex samples or ~0.89 ms) which is dedicated to refreshing the predistortion table.

The demodulated signal r collected during the adaptation periods is compared with the adaptation signal in order to update the predistortion table. The adaptation signal, expressed in polar coordinates $\rho_0$, $\phi_0$ is delayed by a filter 50 by a time which is preadjusted in order to compensate for the delay which the signal r undergoes when passing through the radio system. The delayed signal m' can thus be compared, using subtractors 52, 54, with the demodulated signal r which corresponds to it. The subtractor 52 produces the difference $\Delta\rho = \rho_r - \rho_{m'}$ between the moduli of the demodulated signal and of the delayed adaptation signal. The subtractor 54 produces the difference $\Delta\phi = \phi_r - \phi_{m'}$ between the phases of the demodulated signal and the delayed adaptation signal. An adaptation unit 56 updates the predistortion table. If $k = q(\rho_{m'})$ denotes the address in the memory 46 corresponding to a sample of the modulus $\rho_{m'}$ of the delayed adaptation signal ($k = q(\rho_{m'})$ is represented by the 5 most significant bits of $\rho_{m'}$ in the quantizing example considered above, where K=32), the adaptation may simply consist in updating the values $\rho_d^{(k)}$ and $\delta\phi^{(k)}$ stored at the address k, according to:

$$\rho_d^{(k)} = \rho_d^{(k)} - c_\rho \cdot \Delta\rho \quad (1)$$

$$\delta\phi^{(k)} = \delta\phi^{(k)} - c_\phi \cdot \Delta\phi \quad (2)$$

where $c_\rho$ and $c_\phi$ are damping coefficients between 0 and 1. In FIG. 4, reference 58 denotes the digital means used to update the predistortion table, namely the arithmetic unit 42, the filter 50, the subtractors 52, 54 and the adaptation unit 56.

Figure 5:
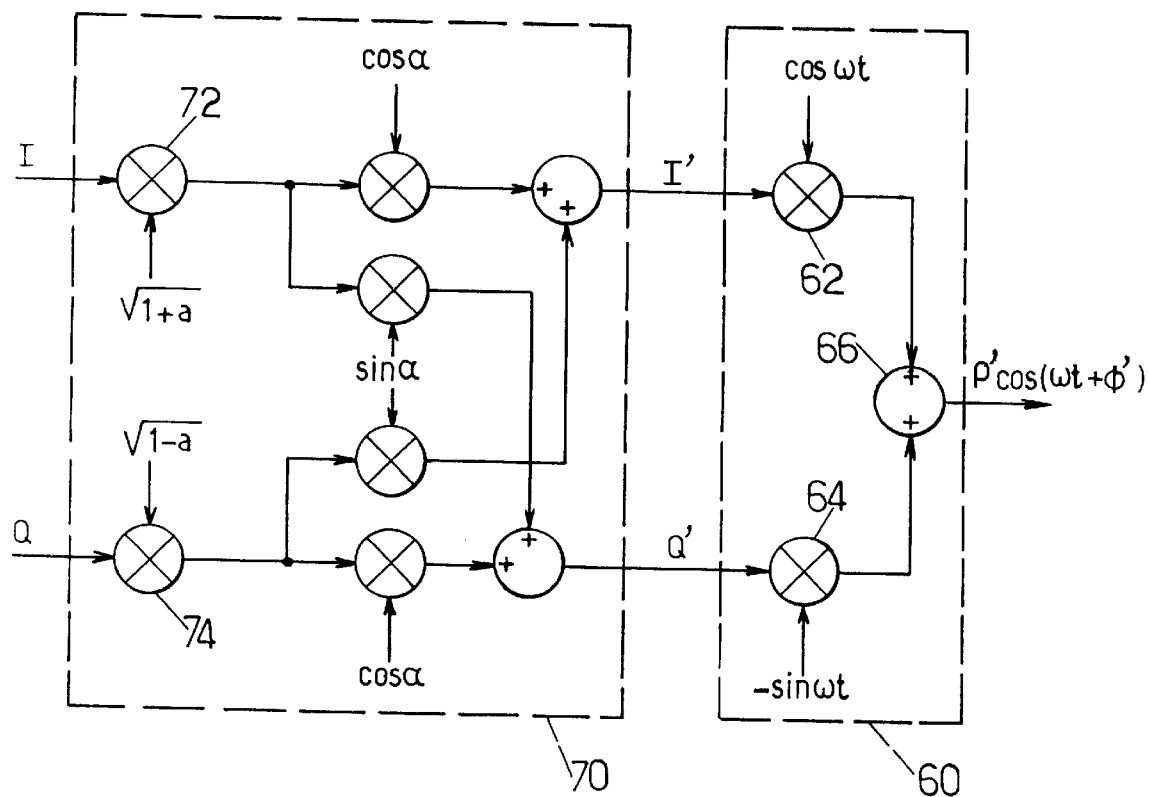
FIG. 5 is an outline diagram of a quadrature radio modulator.

The assumption that the distortions to be compensated are only of AM-AM and AM-PM type does not take into account balance and/or quadrature defects which the modulator 16 or the demodulator 26 may have. FIG. 5 is a diagram modelling a modulator having defects of this type (a similar presentation could be given for the demodulator). Reference 60 denotes an ideal quadrature modulator with two multipliers 62, 64 modulating the wave coswt by the in-phase component I' present at the input, and the wave –sin ωt by the quadrature component Q', respectively, and an adder 66 which delivers the modulated signal using the outputs of the multipliers 62, 64 (of course, the modulation may also be effected via one or more intermediate frequencies). In the case of the ideal modulator, the modulated signal is of the form p'cos(ωt+φ') if $I'+jQ' = \rho' e^{j\phi'}$. A balance defect results in the fact that the components I and Q undergo different gains in the modulator, which is represented by the multipliers 72 and 74, respectively applying gains $\sqrt{1+a}$ and $\sqrt{1-a}$ to the in-phase and quadrature components (a≠0 creates a balance defect). A quadrature defect would correspond to the fact that the two waves output by the local oscillator are not exactly in quadrature. In the defect model 70 represented in FIG. 5, a quadrature defect corresponds to a non-zero angle α, the input signal I, Q of the real modulator being deformed as $I' = I\cdot\sqrt{1+a}\cdot\cos\alpha + Q\cdot\sqrt{1-a}\cdot\sin\alpha$, $Q' = I\cdot\sqrt{1+a}\cdot\sin\alpha + Q\cdot\sqrt{1-a}\cdot\cos\alpha$ at the input of an ideal modulator 60. With this model, the modulus ρ' and the phase φ' of the modulated signal satisfy the following equations, as a function of the modulus ρ and the phase φ of the complex signal I, Q:

$$\left(\frac{\rho'}{\rho}\right)^2 = 1 + a\cdot\cos 2\phi + \sqrt{1-a^2}\cdot\sin 2\phi\cdot\sin 2\alpha \quad (3)$$

$$\tan\phi' = \frac{\sqrt{1-a}\cdot\tan\phi + \sqrt{1+a}\cdot\tan\alpha}{\sqrt{1+a} + \sqrt{1-a}\,\tan\phi\tan\alpha} \quad (4)$$

The modulus is deformed as a function of the phase at the input (PM-AM distortion), and the phase at the output depends nonlinearly on the phase at the input (PM-PM distortion). This contradicts the assumption of AM-AM and AM-PM distortion, on which the predistortion technique is based. Balance and quadrature defects therefore degrade the performance of linearization using predistortion.

In practice, the balance and quadrature defects are relatively weak (a and α being small), so that the PM-AM and PM-PM distortions cause only a small perturbation of the spectrum. Although these distortions may remain acceptable in terms of the spectral broadening which they cause directly outside the adaptation periods, the inventors have observed that they adversely affect the performance by furthermore causing convergence of the predistortion table to unsuitable values.

This latter drawback can be overcome by using a complex adaptation signal having a phase $\phi_0$ which is constant modulo π, that is to say in-phase and quadrature components in a ratio with constant proportionality (=tan $\phi_0$). According to equations (3) and (4), if tan φ is constant, the distortion induced by the balance and quadrature defects is equivalent to multiplying the modulating signal by a complex constant, and this does not interfere with the convergence behaviour of the pre-distortion algorithm.

In practice, the predistortion unit 12 introduces a certain fluctuation δφ in the phase $\phi_d$ of the predistorted signal applied to the modulator 16, when the phase $\phi_0$ of the adaptation signal is constant. Nevertheless, the amplitude of this fluctuation remains small, given that it corresponds approximately to the phase distortions due to the nonlinearities of the amplifier 20, which are typically less than 10°. In consequence, this fluctuation δφ does not interfere too greatly with the convergence, and in any case much less significantly than if the phase $\phi_0$ were allowed to vary with an amplitude of the order of π. The phase fluctuation δφ is moreover compensated by the nonlinearity of the amplifier 20 in the input signal r' of the demodulator 26, so that the PM-AM and PM-PM distortions induced by the demodulator remain approximately constant during the adaptation and do not interfere with the convergence.

Figure 6:
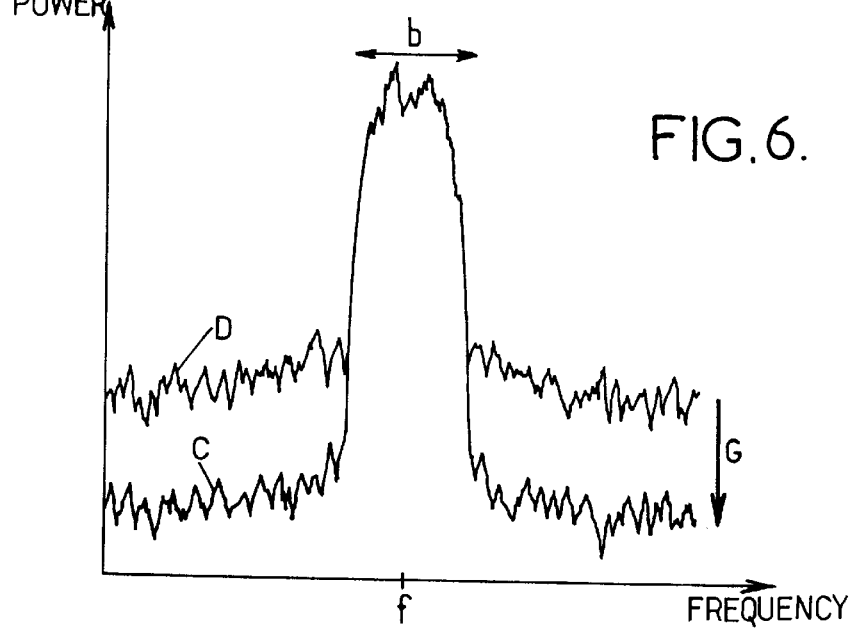
FIG. 6 is a graph showing the improvement afforded by using an adaptation signal with constant phase on the spectrum of the linearized signal.

By way of comparison, FIG. 6 shows the spectrum of an amplified radio signal obtained (outside the adaptation periods) by using an adaptation signal with constant phase (curve C) and an adaptation signal with variable phase of the same kind as the input signal m generated outside the adaptation periods (curve D). For a given power in the passband b, and with balance and quadrature defects which are typical of the modulators and demodulators commonly employed in mobile radio communications terminals, a reduction G is observed, which may be as much as 10 dB or more, in the noise level generated in the adjacent channels, by virtue of the better convergence of the predistortion algorithm.

In the example represented in FIG. 4, the adaptation signal, with a phase which is constant modulo π, is generated with the aid of a memory 80 of the PROM type, from which the successive samples of a function $x_0(t)$ are read at the rate $F_s$. Two multipliers 82, 84 multiply the output $x_0$ of the memory 80 by constants $c_0$ and $s_0$ in order respectively to produce the in-phase $I_0$ and quadrature $Q_0$ components of the adaptation signal. Two switches 86, 88 are controlled by the transmission controller of the terminal in order to address, to the input of the arithmetic unit 40, the components $I_m$, $Q_m$ output by the digital signal source 10 outside the adaptation periods (position 0), and the components $I_0$, $Q_0$ of the adaptation signal during the adaptation periods (position 1). The phase $\phi_0$ of the adaptation signal is then constant modulo π, with $\tan \phi_0 = s_0/c_0$, the modulus $\rho_0$ of the adaptation signal being given by $\rho_0^2 = x_0^2 \cdot (s_0^2 + c_0^2)$. The choice $s_0 = c_0 = 1$ ($\phi_0 = \pi/4$ or $5\pi/4$) is convenient because it makes it possible to dispense with the multipliers 82, 84 ($I_0 = Q_0 = x_0$). The values of the function $x_0(t)$ which are stored in the memory 80 are chosen so as to have a distribution which is capable of exploring the desired dynamic range of the amplifier 20.

Figure 7:
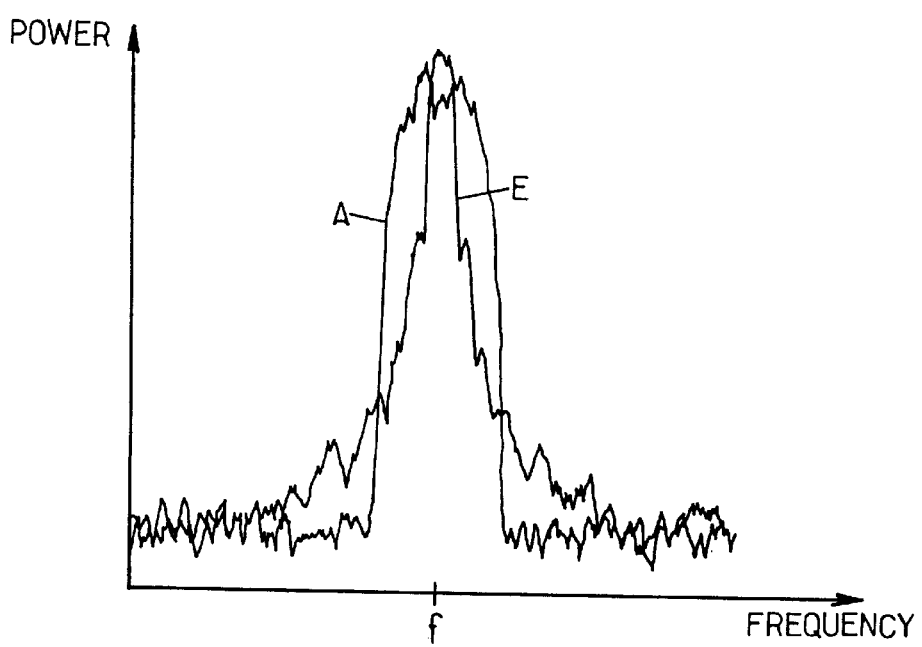
FIG. 7 is a graph showing the spectrum of the signal transmitted during the adaptation phases when a narrow-band adaptation signal is used.

It has furthermore been observed that it is expedient to choose an adaptation signal that has a substantially narrower spectrum than the input signal m generated outside the adaptation periods. When the predistortion algorithm has not yet converged, this avoids generating undesirable power outside the bandwidth, which would disturb the adjacent channels. One way of doing this consists in reducing the bit rate of the binary data source 30 during the adaptation periods (the adaptation signal then being obtained not from the memory 80 represented in FIG. 4 but from the output of the filters 34). By way of illustration, FIG. 7 shows (curve E) the spectrum of a π/4-DQPSK radio signal amplified nonlinearly and obtained from an adaptation signal generated by reducing the bit rate of the binary data source 30 by a factor of 4 (9 kbit/s instead of 36 kbit/s). This curve E should be compared with curve B in FIG. 3, which would be its equivalent if the bit rate of the binary data source were kept unchanged in the adaptation periods. It is seen that using a narrow-band adaptation signal leads to a great reduction in the power radiated outside the channel during the adaptation periods.

In a preferred version of the invention, the adaptation signal has the properties of both constant phase and narrow band, the advantages of which were presented above. A convenient way of doing this is to provide an adaptation signal whose real and imaginary parts are proportional to the same sinusoidal waveform of frequency $f_0$ which is substantially less than one quarter of the bit rate of the binary data source 30. The spectrum of the adaptation signal then reduces to two lines which are $2f_0$ apart. In the example represented in FIG. 4, it is sufficient for a function $x_0(t)$, proportional to $\cos(2\pi f_0 t + \theta)$ with θ being a constant, to be stored in the memory 80. In the above-mentioned example, of a bit rate of 36 kbit/s at the output of the source 30, satisfactory results were obtained by taking $f_0 = 4.5$ kHz.

Figure 8:
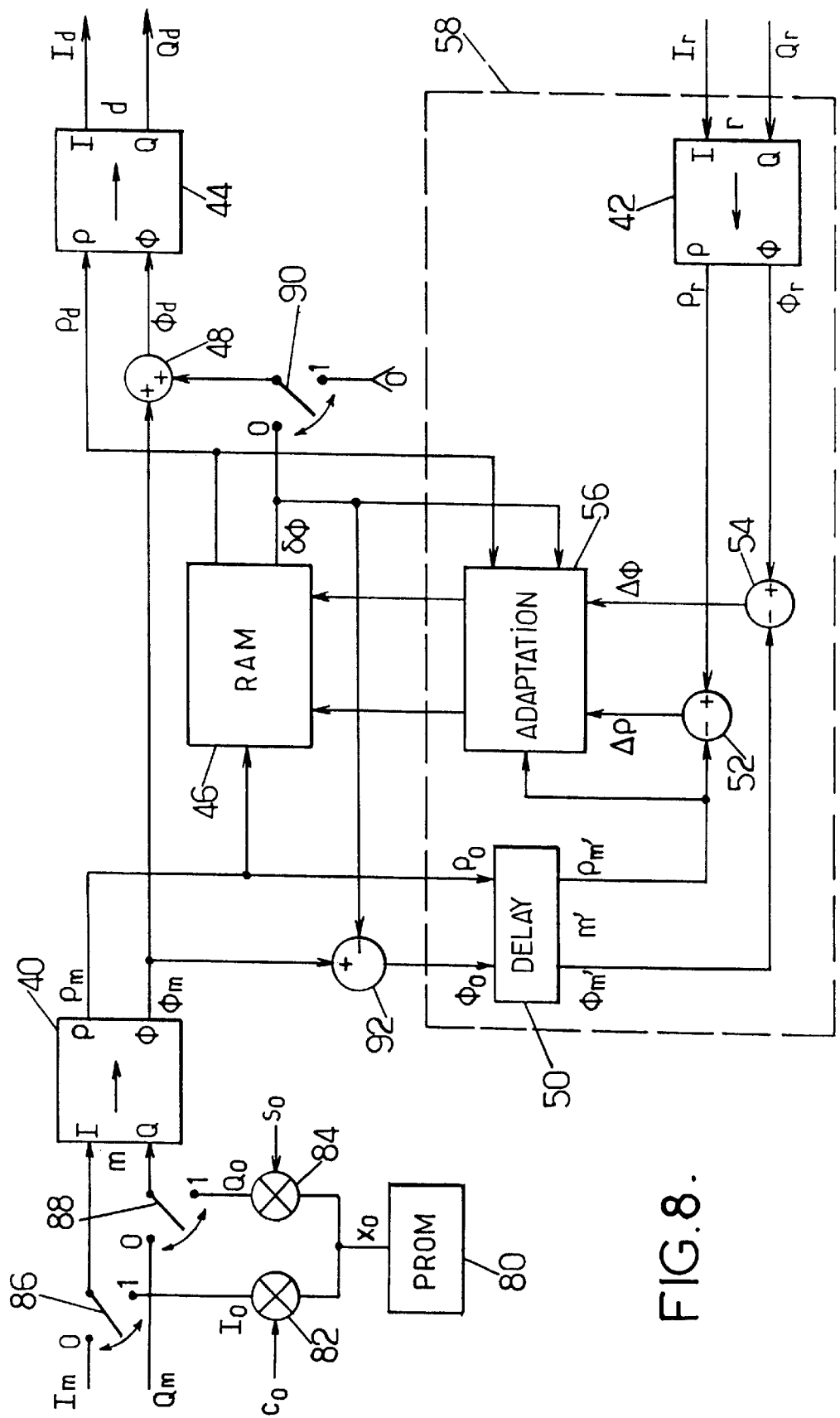
FIG. 8 shows an alternative embodiment of a predistortion unit.

The alternative embodiment of the predistortion unit 12, represented in FIG. 8, differs from the one in FIG. 4 in that the phase which is kept constant modulo π is not that of the adaptation signal but that of the pre-distorted adaptation signal. Since the phase is then constant (modulo π) at the input of the modulator 16, the convergence of the adaptation algorithm is not interfered with by the balance and quadrature defects of the demodulator (equations (1) and (2)), independently of the phase predistortions δφ contained in the predistortion table. The downside of this is that the AM-PM distortion due to the nonlinearities of the amplifier 20 causes a fluctuation of the order of δφ (generally small) at the input of the demodulator 26.

The constituent elements of the predistortion unit represented in FIG. 8 are, for the most part, identical to those described with reference to FIG. 4, and are denoted by the same numerical references. A switch 90 is added so that the phase predistortion δφ read from the memory 46 is only transmitted to the adder 48 outside the adaptation periods (position 0). In the adaptation periods, the switch 90 addresses a zero value to the adder 48 (position 1), which ensures that the phase of the predistorted signal corresponds to the phase, which is constant modulo π, delivered by the arithmetic unit 40. In order to reconstruct the adaptation signal with which the constant-phase predistorted signal is associated, a subtractor calculates the difference between the phase $\phi_m$ delivered by the arithmetic unit 40 and the phase predistortion δφ read from the memory 46. This difference represents the phase $\phi_0$ of the adaptation signal and is fed to the update means 58 so that, after the ad hoc delay, it is compared with the phase $\phi_r$ of the demodulated signal.

It will be noted that, in the case represented in FIG. 8, neither the adaptation signal, the phase $\phi_0$ of which depends on the values δφ stored in the table, nor the distortion signal, the modulus $\rho_d$ of which is read from the table, are known a priori. However, the modulus $\rho_0$ of the adaptation signal and the phase $\phi_d$ ($\tan \phi_d = s_0/c_0$) of the predistorted signal are predefined. By taking the function $x_0(t)$ as proportional to $\cos(2\pi f_0 t + \theta)$, as explained above, the adaptation signal and the predistorted signal have a narrower spectrum in the adaptation periods than outside these periods, which ensures little disturbance of the adjacent channels. If $c_0 = s_0$, the predistorted signal has identical real and imaginary parts.

Figure 9:
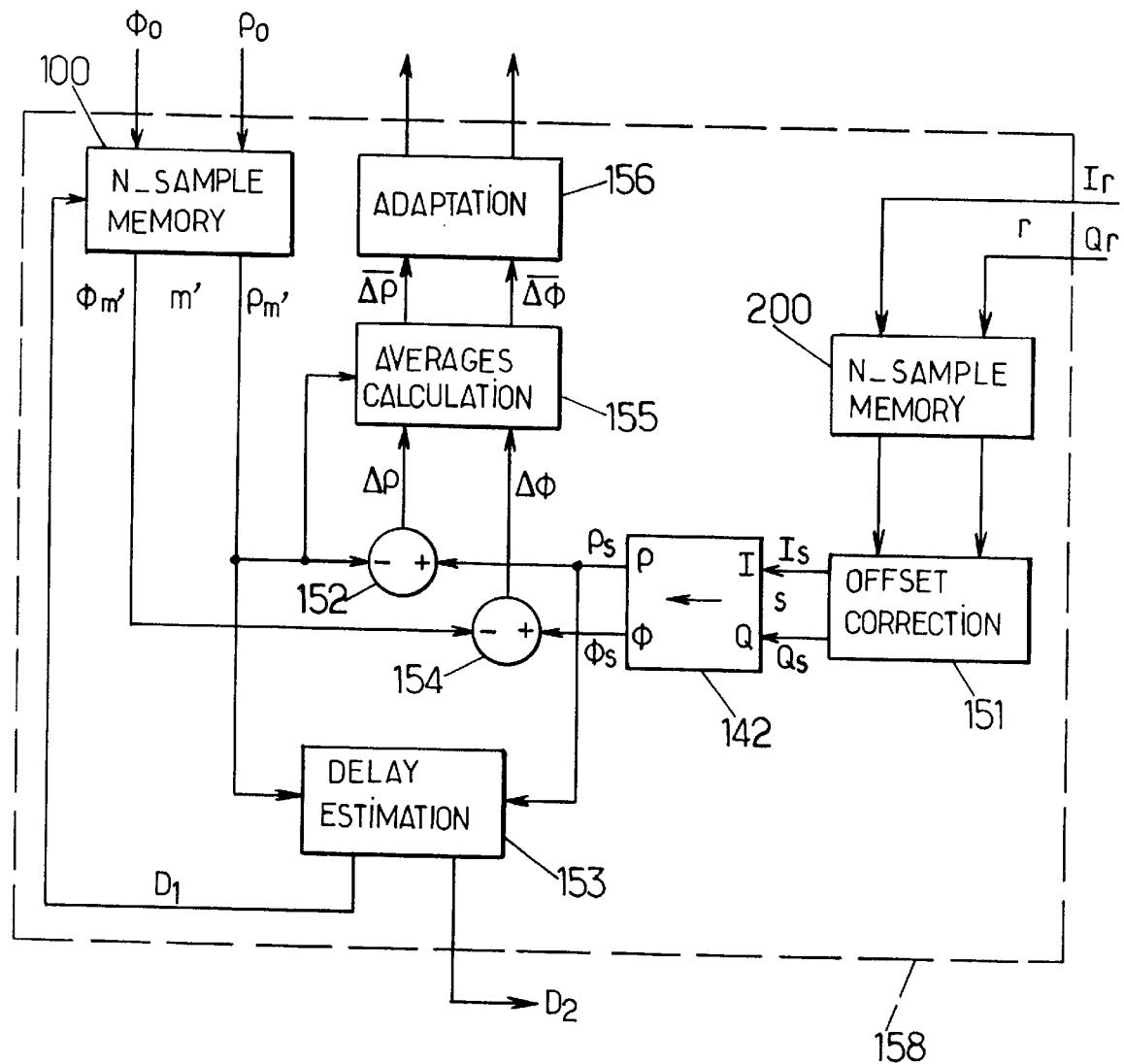
FIG. 9 is a block diagram of means for updating a predistortion table.

FIG. 9 shows an advantageous alternative embodiment 158 of the update means 58 of a predistortion unit according to FIG. 4 or FIG. 8. Two buffer memories 100, 200 are provided in order to store N successive complex samples of the adaptation signal and of the demodulated signal in the adaptation periods. The number N is typically chosen to be equal to the number of samples at the frequency $F_s$ of the adaptation signal in the adaptation period. In the example represented, the memory 100 receives the polar coordinates $\rho_0$, $\phi_0$ of the adaptation signal, while the memory 200 receives the Cartesian coordinates $I_r$, $Q_r$ of the demodulated signal r.

The processing operations for updating the predistortion table are carried out after the reception of the two blocks of N samples of the adaptation signal and of the demodulated signal. The first of these processing operations, carried out by the unit 151, consists in correcting an offset which the demodulated signal r may have. Since the adaptation signal has zero mean, the same should be true for the demodulated signal. However, defects in the modulator 16 and/or in the demodulator 26 may cause an offset in the demodulated signal. In order to prevent this offset from affecting the predistortion algorithm, the unit 151 calculates the means, over the block of N samples, of the in-phase and quadrature components of the demodulated signal, and subtracts these means from the stored samples:

$$\bar{I} = \frac{1}{N}\sum_{i=1}^{N} I_r(i)$$

$$\bar{Q} = \frac{1}{N}\sum_{i=1}^{N} Q_r(i)$$

and, for $i=1, \ldots, N$: $I_s(i)=I_r(i)-\bar{I}$, and $Q_s(i)=Q_r(i)-\bar{Q}$. In the above expressions, $I_r(i)$ and $Q_r(i)$ denote the i-th stored samples of the in-phase and quadrature components of the demodulated complex signal r, and $I_s(i)$ and $Q_s(i)$ denote the i-th samples of the in-phase and quadrature components of a corrected demodulated signal s which the correction unit 151 feeds co the arithmetic unit 142. The unit 142 produces the modulus $\rho_s$ and the phase $\phi_s$ of the corrected demodulated signal s.

Another processing operation, carried out by a unit 153, consists in estimating the delay of the demodulated signal r with respect to the adaptation signal which corresponds to it. This estimation comprises the calculation of a correlation $\Delta D$ according to:

$$\Delta D = \frac{1}{L}\sum_{i=1}^{L} \rho_s(i)\cdot[\rho_{m'}(i-1)-\rho_{m'}(i+1)+\rho_s(i+1)-\rho_s(i-1)]$$

followed by an update of the delay D applied to the adaptation signal, according to:

$$D=D+c_d\cdot\Delta D/F_s$$

In the above expressions, $c_d$ denotes a damping coefficient between 0 and 1, L denotes a block length for the estimation of the delay (L≦N, typically L~100), $\rho_s(i)$ denotes the i-th sample of the modulus of the corrected demodulated signal, and $\rho_{m'}(i)$ denotes the i-th sample of the modulus of the delayed adaptation signal. Once the estimation of the delay D is giving a stable value, this value is frozen in order to avoid the calculations performed by the unit 153. Since the estimated delay D is of the form $D=D_1/F_s+D_2$, with $0\leq D_2<1/F_s$ and $D_1$ an integer, a convenient possibility for applying this delay consists in feeding the integer delay $D_1$ to the memory 100 in order to shift the reading of the samples $\rho_{m'}$, $\phi_{m'}$, by $D_1$ addresses in this memory, and using the fractional delay $D_2$ to shift the clock of the analog/digital converter 28.

The update means 158 represented in FIG. 9 comprise two subtractors 152, 151 which calculate the respective differences between the moduli and the phases of the corrected demodulated signal s and of the delayed adaptation signal m': $\Delta\rho(i)=\rho_s(i)-\rho_{m'}(i)$ and $\Delta\phi(i)=\phi_s(i)-\phi_{m'}(i)$. These differences $\Delta\rho(i)$, $\Delta\phi(i)$ are fed to a mean-value calculation unit 155. For each index k used for quantizing the moduli $\rho_m$ at the input of the memory 46, the unit 155 calculates the means $\overline{\Delta\rho}^{(k)}$ and $\overline{\Delta\phi}^{(k)}$ of the deviations $\Delta\rho(i)$ and $\Delta\phi(i)$ delivered by the subtractors 152, 154, for which the modulus $\rho_{m'}$ of the adaptation signal is quantized by the index k:

$$\overline{\Delta\phi}^{(k)} = \frac{\sum_{\substack{i=1 \\ q(\rho_{m'}(i))=k}}^{N} \Delta\phi(i)}{\sum_{\substack{i=1 \\ q(\rho_{m'}(i))=k}}^{N} 1}$$

$$\overline{\Delta\rho}^{(k)} = \frac{\sum_{\substack{i=1 \\ q(\rho_{m'}(i))=k}}^{N} \Delta\rho(i)}{\sum_{\substack{i=1 \\ q(\rho_{m'}(i))=k}}^{N} 1}$$

The adaptation unit 156 then updates the values $\rho_d^{(k)}$ and $\delta\phi^{(k)}$ stored at each address k ($1\leq k\leq K$) in the memory 46, according to:

$$\rho_d^{(k)}=\rho_d^{(k)}-c_\rho\cdot\overline{\Delta\rho}^{(k)} \qquad (5)$$

$$\delta\phi^{(k)}=\delta\phi^{(k)}-c_\phi\cdot\overline{\Delta\phi}^{(k)} \qquad (6)$$

The values stored at the K addresses in the predistortion table are thus updated at the end of the processing of a block of N samples. In comparison with the use of equations (1) and (2) without averaging, the use of mean values $\overline{\Delta\rho}^{(k)}$ and $\overline{\Delta\phi}^{(k)}$ in equations (5) and (6) makes it possible to reduce the errors due to the defects of the modulator and/or of the demodulator (balance or quadrature) and to inter-sample interference, and also to reduce the influence of the noise present in the demodulated signal. The averaging also allows the predistortion algorithm to converge faster. Processing by blocks has the further advantages of measuring and eliminating the zero offset of the demodulated signal (unit 151) and of allowing a fine estimation of the delay D which is to be applied to the adaptation signal.

We claim:

1. Method of correcting nonlinearities of an amplifier which receives a radio signal and produces an amplified radio signal representing an input complex digital signal, comprising the steps of:

storing a predistortion table, associating a value of a predistorted complex digital signal with each value of the input complex digital signal; and modulating the predistorted complex signal in order to obtain the radio signal addressed to the amplifier, wherein there is provided at least one adaptation period in which a fraction of an amplified radio signal output by the amplifier is demodulated in order to obtain a demodulated complex signal which is compared with the input complex signal, with which the predistorted complex signal modulated in said adaptation period is associated, in order to update the predistortion table, wherein the predistortion table is updated on the basis of mean values calculated from blocks of samples of the input complex signal and of the demodulated complex signal, which are stored in the adaptation period, and wherein the modulus of the input complex signal is quantized for addressing in the predistortion table, the predistortion table associating a modulus value and a phase-shift value for the predistorted signal with each quantizing value of the modulus of the input complex signal, the method further comprising the steps of:

calculating for each quantizing value of the modulus of the input complex signal, a mean value of the difference in modulus between the demodulated complex signal and the input complex signal, and a mean value of the phase difference between the demodulated complex signal and the input complex signal, said mean values being calculated for the samples of the input complex signal in the block stored in the adaptation period, whose modulus is quantized by said quantizing value; and updating the modulus value and the phase-shift value of the predistorted complex signal, which are associated with said quantizing value, on the basis of said calculated mean values.

2. Method of correcting nonlinearities of an amplifier which receives a radio signal and produces an amplified radio signal representing an input complex digital signal, comprising the steps of:

storing a predistortion table, associating a value of a predistorted complex digital signal with each value of the input complex digital signal; and modulating the predistorted complex signal in order to obtain the radio signal addressed to the amplifier, wherein there is provided at least one adaptation period in which a fraction of an amplified radio signal output by the amplifier is demodulated in order to obtain a demodulated complex signal which is compared with the input complex signal, with which the predistorted complex signal modulated in said adaptation period is associated, in order to update the predistortion table, wherein the predistortion table is updated on the basis of mean values calculated from blocks of samples of the input complex signal and of the demodulated complex signal, which are stored in the adaptation period, and wherein each block of samples of the demodulated complex signal is stored in the form of in-phase components and quadrature components, the method further comprising the steps of:

estimating a mean value of the in-phase components of the block and a mean value of the quadrature components of the block; and producing a corrected demodulated complex signal in order to update the predistortion table by respectively subtracting, from the stored in-phase and quadrature components of each sample of the demodulated complex signal, the estimated mean values of said in-phase and quadrature components.

3. Method of correcting nonlinearities of an amplifier which receives a radio signal and produces an amplified radio signal representing an input complex digital signal, comprising the steps of:

storing a predistortion table, associating a value of a predistorted complex digital signal with each value of the input complex digital signal; and modulating the predistorted complex signal in order to obtain the radio signal addressed to the amplifier, wherein there is provided at least one adaptation period in which a fraction of an amplified radio signal output by the amplifier is demodulated in order to obtain a demodulated complex signal which is compared with the input complex signal, with which the predistorted complex signal modulated in said adaptation period is associated, in order to update the predistortion table, wherein the predistortion table is updated on the basis of mean values calculated from blocks of samples of the input complex signal and of the demodulated complex signal, which are stored in the adaptation period, the method further comprising the steps of:

calculating a correlation between the modulus of the demodulated complex signal and the modulus of the input complex signal; and comparing the demodulated complex signal with the input complex signal, delayed by a time which is adjusted with reference to the calculated correlation, in order to update the predistortion table.

4. Method of correcting nonlinearities of an amplifier which receives a radio signal and produces an amplified radio signal representing an input complex digital signal, comprising the steps of:

storing a predistortion table, associating a value of a predistorted complex digital signal with each value of the input complex digital signal; and modulating the predistorted complex signal in order to obtain the radio signal addressed to the amplifier, wherein there is provided at least one adaptation period in which a fraction of an amplified radio signal output by the amplifier is demodulated in order to obtain a demodulated complex signal which is compared with the input complex signal, with which the predistorted complex signal modulated in said adaptation period is associated, in order to update the predistortion table, wherein the predistortion table is updated on the basis of mean values calculated from blocks of samples of the input complex signal and of the demodulated complex signal, which are stored in the adaptation period, and wherein the input complex signal or the predistorted complex signal has a phase which is constant modulo 7 in the adaptation period.

5. Method of correcting nonlinearities of an amplifier which receives a radio signal and produces an amplified radio signal representing an input complex digital signal, comprising the steps of:

storing a predistortion table, associating a value of a predistorted complex digital signal with each value of the input complex digital signal; and modulating the predistorted complex signal in order to obtain the radio signal addressed to the amplifier, wherein there is provided at least one adaptation period in which a fraction of an amplified radio signal output by the amplifier is demodulated in order to obtain a demodulated complex signal which is compared with the input complex signal, with which the predistorted complex signal modulated in said adaptation period is associated, in order to update the predistortion table, wherein the predistortion table is updated on the basis of mean values calculated from blocks of samples of the input complex signal and of the demodulated complex signal, which are stored in the adaptation period, and wherein the input complex signal has a narrower spectrum within the adaptation period than outside the adaptation period.

6. Method of correcting nonlinearities of an amplifier which receives a radio signal and produces an amplified radio signal representing an input complex digital signal, comprising the steps of:

storing a predistortion table, associating a value of a predistorted complex digital signal with each value of the input complex digital signal; and modulating the predistorted complex signal in order to obtain the radio signal addressed to the amplifier, wherein there is provided at least one adaptation period in which a fraction of an amplified radio signal output by the amplifier is demodulated in order to obtain a demodulated complex signal which is compared with the input complex signal, with which the predistorted complex signal modulated in said adaptation period is associated, in order to update the predistortion table, wherein the predistortion table is updated on the basis of mean values calculated from blocks of samples of the input complex signal and of the demodulated complex signal, which are stored in the adaptation period, and wherein, in the adaptation period, the input complex signal has real and imaginary parts proportional to a common sinusoidal waveform.

7. Method according to claim 4, wherein, in the adaptation period, the input complex signal or the predistorted complex signal has identical real and imaginary parts.

8. Radio transmitter, comprising:

a digital signal source generating an input complex digital signal;

predistortion means including a predistortion table associating a value of a predistorted complex digital signal with each value of the input complex digital signal;

modulation means producing a radio signal from the predistorted complex signal;

a power amplifier for amplifying the radio signal and applying the amplified radio signal to a transmission antenna; and demodulation means producing a demodulated complex signal from a fraction of the amplified radio signal, wherein the predistortion means are designed to update the predistortion table on the basis of a comparison between the demodulated complex signal, produced by the demodulation means in at least one adaptation period, and the input complex signal, with which the predistorted complex signal produced in said adaptation period by the predistortion means is associated, wherein the predistortion means are designed to update the predistortion table on the basis of mean values calculated from blocks of samples of the input complex signal and of the demodulated complex signal which are stored in the adaptation period, and wherein the modulus of the input complex signal is quantized for addressing in the predistortion table, the predistortion table associating a modulus value and a phase-shift value for the predistorted signal with each quantizing value of the modulus of the input complex signal, the radio transmitter further comprising:

means for calculating for each quantizing value of the modulus of the input complex signal, a mean value of the difference in modulus between the demodulated complex signal and the input complex signal, and a mean value of the phase difference between the demodulated complex signal and the input complex signal, said mean values being calculated for the samples of the input complex signal in the block stored in the adaptation period, whose modulus is quantized by said quantizing value; and means for updating the modulus value and the phase-shift value of the predistorted complex signal, which are associated with said quantizing value, on the basis of said calculated mean values.

9. Radio transmitter, comprising:

a digital signal source generating an input complex digital signal;

predistortion means including a predistortion table associating a value of a predistorted complex digital signal with each value of the input complex digital signal;

modulation means producing a radio signal from the predistorted complex signal;

a power amplifier for amplifying the radio signal and applying the amplified radio signal to a transmission antenna; and demodulation means producing a demodulated complex signal from a fraction of the amplified radio signal, wherein the predistortion means are designed to update the predistortion table on the basis of a comparison between the demodulated complex signal, produced by the demodulation means in at least one adaptation period, and the input complex signal, with which the predistorted complex signal produced in said adaptation period by the predistortion means is associated, wherein the predistortion means are designed to update the predistortion table on the basis of mean values calculated from blocks of samples of the input complex signal and of the demodulated complex signal which are stored in the adaptation period, and wherein each block of samples of the demodulated complex signal is stored in the form of in-phase components and quadrature components, the radio transmitter further comprising:

means for estimating a mean value of the in-phase components of the block and a mean value of the quadrature components of the block; and means for producing a corrected demodulated complex signal in order to update the predistortion table by respectively subtracting, from the stored in-phase and quadrature components of each sample of the demodulated complex signal, the estimated mean values of said in-phase and quadrature components.

10. Radio transmitter, comprising:

a digital signal source generating an input complex digital signal;

predistortion means including a predistortion table associating a value of a predistorted complex digital signal with each value of the input complex digital signal;

modulation means producing a radio signal from the predistorted complex signal;

a power amplifier for amplifying the radio signal and applying the amplified radio signal to a transmission antenna; and demodulation means producing a demodulated complex signal from a fraction of the amplified radio signal, wherein the predistortion means are designed to update the predistortion table on the basis of a comparison between the demodulated complex signal, produced by the demodulation means in at least one adaptation period, and the input complex signal, with which the predistorted complex signal produced in said adaptation period by the predistortion means is associated, wherein the predistortion means are designed to update the predistortion table on the basis of mean values calculated from blocks of samples of the input complex signal and of the demodulated complex signal which are stored in the adaptation period, the radio transmitter further comprising:

means for calculating a correlation between the modulus of the demodulated complex signal and the modulus of the input complex signal; and means for comparing the demodulated complex signal with the input complex signal, delayed by a time which is adjusted with reference to the calculated correlation, in order to update the predistortion table.

11. Radio transmitter, comprising:

a digital signal source generating an input complex digital signal;

predistortion means including a predistortion table associating a value of a predistorted complex digital signal with each value of the input complex digital signal;

modulation means producing a radio signal from the predistorted complex signal;

a power amplifier for amplifying the radio signal and applying the amplified radio signal to a transmission antenna; and demodulation means producing a demodulated complex signal from a fraction of the amplified radio signal, wherein the predistortion means are designed to update the predistortion table on the basis of a comparison between the demodulated complex signal, produced by the demodulation means in at least one adaptation period, and the input complex signal, with which the predistorted complex signal produced in said adaptation period by the predistortion means is associated, wherein the predistortion means are designed to update the predistortion table on the basis of mean values calculated from blocks of samples of the input complex signal and of the demodulated complex signal which are stored in the adaptation period, and wherein the input complex signal or the predistorted complex signal has a phase which is constant modulo π in the adaptation period.

12. Radio transmitter, comprising:

a digital signal source generating an input complex digital signal;

predistortion means including a predistortion table associating a value of a predistorted complex digital signal with each value of the input complex digital signal;

modulation means producing a radio signal from the predistorted complex signal;

a power amplifier for amplifying the radio signal and applying the amplified radio signal to a transmission antenna; and demodulation means producing a demodulated complex signal from a fraction of the amplified radio signal, wherein the predistortion means are designed to update the predistortion table on the basis of a comparison between the demodulated complex signal, produced by the demodulation means in at least one adaptation period, and the input complex signal, with which the predistorted complex signal produced in said adaptation period by the predistortion means is associated, wherein the predistortion means are designed to update the predistortion table on the basis of mean values calculated from blocks of samples of the input complex signal and of the demodulated complex signal which are stored in the adaptation period, and wherein the input complex signal has a narrower spectrum within the adaptation period than outside the adaptation period.

13. Radio transmitter, comprising:

a digital signal source generating an input complex digital signal;

predistortion means including a predistortion table associating a value of a predistorted complex digital signal with each value of the input complex digital signal;

modulation means producing a radio signal from the predistorted complex signal;

a power amplifier for amplifying the radio signal and applying the amplified radio signal to a transmission antenna; and demodulation means producing a demodulated complex signal from a fraction of the amplified radio signal, wherein the predistortion means are designed to update the predistortion table on the basis of a comparison between the demodulated complex signal, produced by the demodulation means in at least one adaptation period, and the input complex signal, with which the predistorted complex signal produced in said adaptation period by the predistortion means is associated, wherein the predistortion means are designed to update the predistortion table on the basis of mean values calculated from blocks of samples of the input complex signal and of the demodulated complex signal which are stored in the adaptation period, and wherein, in the adaptation period, the input complex signal has real and imaginary parts proportional to a common sinusoidal waveform.

14. Radio transmitter according to claim 11, wherein, in the adaptation period, the input complex signal or the predistorted complex signal has identical real and imaginary parts.

* * * * *